(12) United States Patent
Remmel et al.

(10) Patent No.: US 7,898,059 B2
(45) Date of Patent: Mar. 1, 2011

(54) SEMICONDUCTOR DEVICE COMPRISING PASSIVE COMPONENTS

(75) Inventors: Thomas P. Remmel, Mesa, AZ (US); Peter Zurcher, Phoenix, AZ (US); Sriram Kalpat, Austin, TX (US); Melvy F. Miller, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/426,837

(22) Filed: Apr. 20, 2009

(65) Prior Publication Data

US 2009/0224365 A1 Sep. 10, 2009

Related U.S. Application Data

(62) Division of application No. 11/899,218, filed on Sep. 4, 2007, now Pat. No. 7,535,079, and a division of application No. 11/150,499, filed on Jun. 9, 2005, now Pat. No. 7,306,986, and a division of application No. 10/799,554, filed on Mar. 10, 2004, now Pat. No. 6,919,244.

(51) Int. Cl.
*H01L 29/00* (2006.01)
(52) U.S. Cl. ............ 257/532; 257/533; 257/E29.343
(58) Field of Classification Search ........ 257/295, 257/296, 303, 306, 310, 532, 533, E27.087, 257/E27.088, E29.343
See application file for complete search history.

(56) References Cited

U.S. PATENT DOCUMENTS

| 6,436,756 | B1 | 8/2002 | Nishimura et al. |
| 6,838,717 | B1 * | 1/2005 | Yen et al. ............ 257/295 |
| 2001/0023098 | A1 | 9/2001 | Tsugane et al. |
| 2003/0127705 | A1 | 7/2003 | Kwak et al. |

FOREIGN PATENT DOCUMENTS

| EP | 1248287 B1 | 6/2006 |
| WO | 99/0036651 | 12/1999 |

OTHER PUBLICATIONS

PCT Application No. PCT/US2005/004008, Supplementary Search Report dated May 19, 2010.

* cited by examiner

*Primary Examiner* — Hoai v Pham

(57) ABSTRACT

A method of making a semiconductor device includes the steps of: providing a semiconductor substrate (110, 510, 1010, 1610) having a patterned interconnect layer (120, 520, 1020, 1620) formed thereon; depositing a first dielectric material (130, 530, 1030, 1630) over the interconnect layer; depositing a first electrode material (140, 540, 1040, 1640) over the first dielectric material; depositing a second dielectric material (150, 550, 1050, 1650) over the first electrode material; depositing a second electrode material (160, 560, 1060, 1660) over the second dielectric material; patterning the second electrode material to form a top electrode (211, 611, 1111, 1611) of a first capacitor (210, 710, 1310, 1615); and patterning the first electrode material to form a top electrode (221, 721, 1221, 1621) of a second capacitor (220, 720, 1320, 1625), to form an electrode (212, 712, 1212, 1612) of the first capacitor, and to define a resistor (230, 730, 1330).

19 Claims, 12 Drawing Sheets

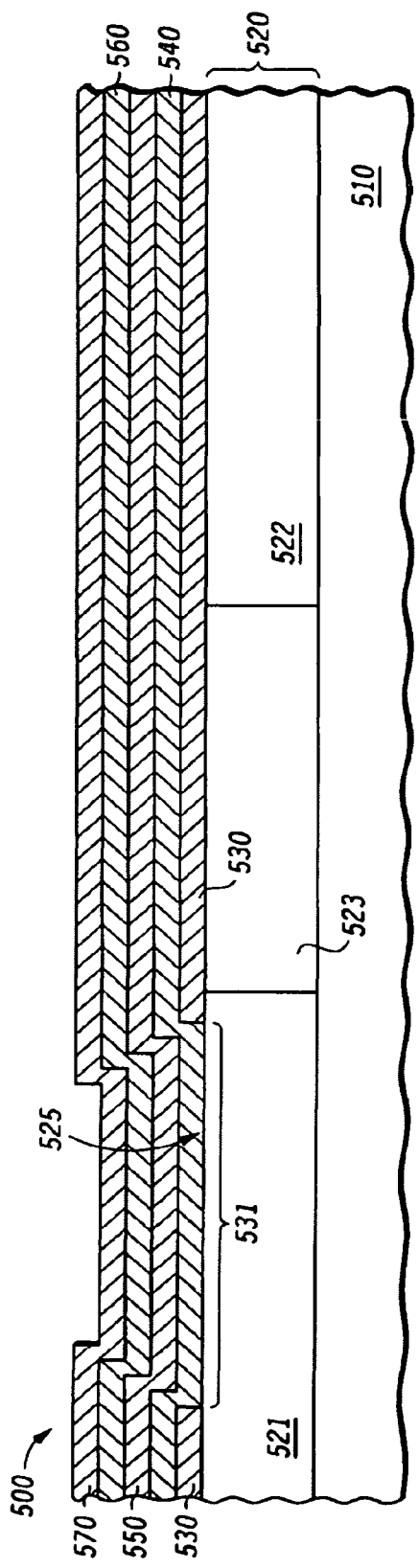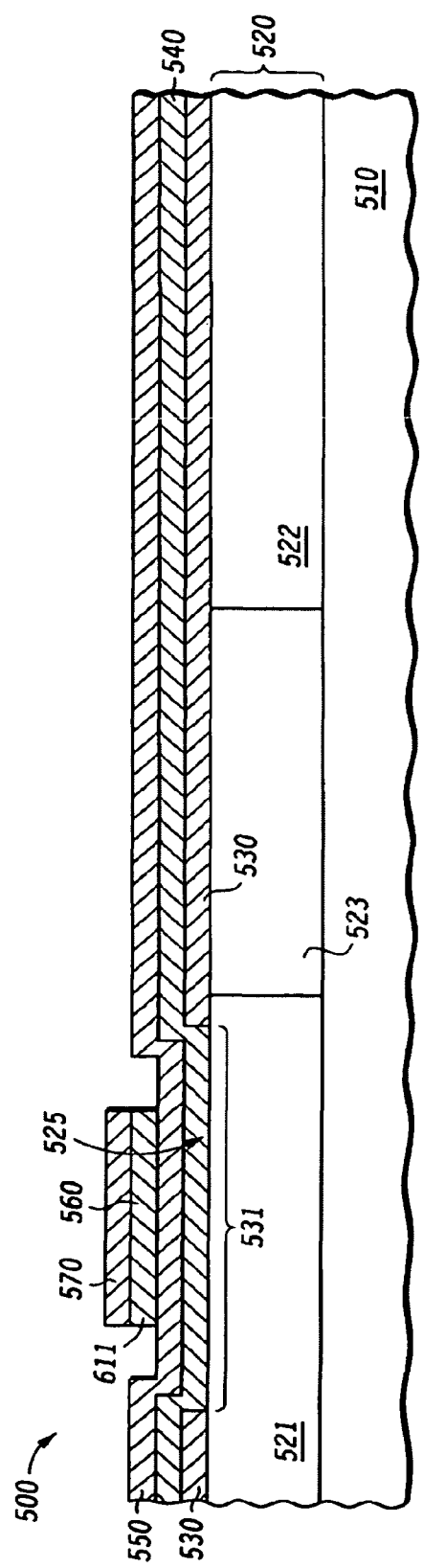

SEMICONDUCTOR DEVICE COMPRISING PASSIVE COMPONENTS

CROSS-REFERENCE TO RELATED APPLICATIONS

This is a divisional application of application Ser. No. 11/899,218, filed Sep. 4, 2007, which is a divisional of U.S. Pat. No. 7,306,986, filed Jun. 9, 2005. U.S. Pat. No. 7,306,986 is a divisional of U.S. Pat. No. 6,919,244, filed Mar. 10, 2004. Application Ser. No. 11/899,218 and U.S. Pat. Nos. 7,306,986 and 6,919,244 are incorporated herein by reference.

FIELD OF THE INVENTION

This invention relates generally to semiconductor devices, and relates more particularly to passive components in semiconductor devices.

BACKGROUND OF THE INVENTION

Passive components such as capacitors, resistors, inductors, and the like are used in semiconductor devices to perform a wide variety of functions. The passive components can be optimized for a particular function or functions by, for example, controlling the size and dimensions of the passive component, and/or by controlling the materials used to form the passive component. As an example, consider a metal-insulator-metal (MIM) capacitor formed within an inter-layer-dielectric (ILD) region of a semiconductor device. If a high capacitive density is desired, the MIM capacitor can be constructed such that its thickness is as small as possible, and/or can be constructed using materials having high dielectric constants. On the other hand, if a high performance capacitor is desired, the MIM capacitor can be constructed using materials that provide high linearity, low leakage, and a low temperature coefficient of capacitance (TCC). For many applications, both a high performance capacitor and a high density capacitor are desired on a single integrated circuit. Current fabrication methods, however, are incapable of providing such a circuit. Accordingly, there exists a need for a semiconductor component, and a method of making the semiconductor component, in which both a high performance capacitor and a high density capacitor are integrated on a single integrated circuit.

BRIEF DESCRIPTION OF THE DRAWINGS

The invention will be better understood from a reading of the following detailed description, taken in conjunction with the accompanying figures in the drawings in which:

FIG. 5 is a cross-sectional view of a portion of another semiconductor device at a particular point in a manufacturing process according to an embodiment of the invention;

FIG. 6 is a cross-sectional view of a portion of the semiconductor device of FIG. 5 at a later stage of the manufacturing process according to an embodiment of the invention;

Figure 1:
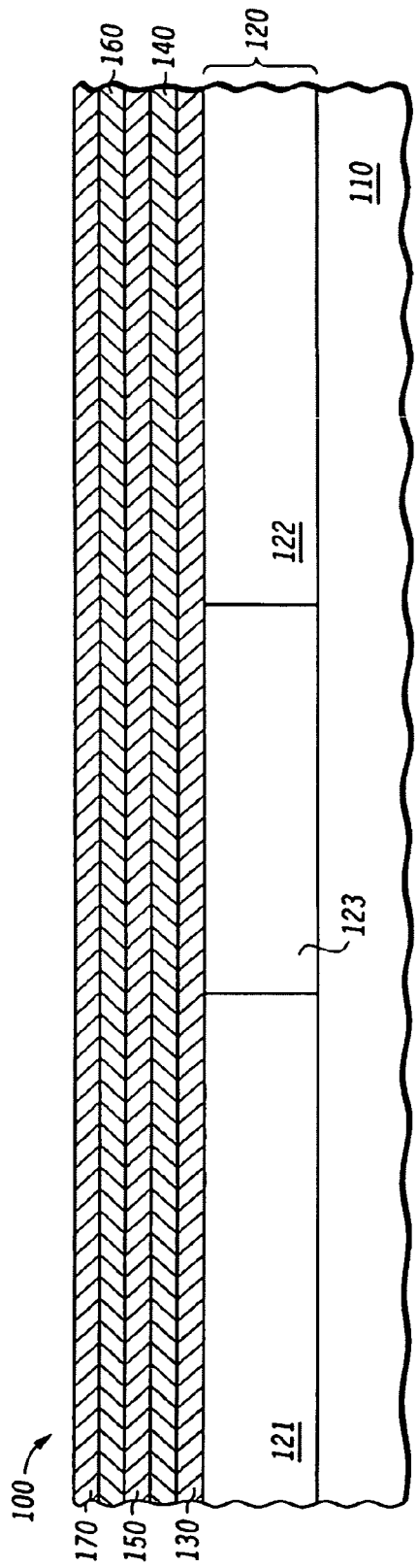
FIG. 1 is a cross-sectional view of a portion of a semiconductor device at a particular stage in a manufacturing process according to an embodiment of the invention.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical, mechanical, or other manner.

DETAILED DESCRIPTION OF THE DRAWINGS

In one embodiment of the invention, a method of making a semiconductor device comprises: providing a semiconductor substrate having a patterned interconnect layer formed thereon; depositing a first dielectric material over the patterned interconnect layer; depositing a first electrode material over the first dielectric material; depositing a second dielectric material over the first electrode material; depositing a second electrode material over the second dielectric material; depositing a third dielectric material over the second electrode material; patterning the third dielectric material and the second electrode material to form a top electrode of a first capacitor; and patterning the second dielectric material and the first electrode material to form a top electrode of a second capacitor, to form an electrode of the first capacitor, and to define a resistor. In another embodiment of the invention, the patterned interconnect layer forms a bottom electrode of the second capacitor and is absent from the first capacitor, and patterning the first electrode material does not define a resistor.

It should be understood that the word "over" as used herein may, but does not necessarily, mean "on." Accordingly, for example, the phrase "depositing a second dielectric material over the first electrode material" can mean, in at least one embodiment of at least one of the methods described herein, depositing a second dielectric material on the first electrode material. Similar phrases herein can have similar meanings with respect to the words "over" and "on."

FIG. 1 is a cross-sectional view of a portion of a semiconductor device 100 at a particular stage in a manufacturing process according to an embodiment of the invention. As illustrated in FIG. 1, semiconductor device 100 comprises a semiconductor substrate 110, a patterned interconnect layer 120 above semiconductor substrate 110, a dielectric material 130 over patterned interconnect layer 120, an electrode material 140 over dielectric material 130, a dielectric material 150 over electrode material 140, an electrode material 160 over dielectric material 150, and a dielectric material 170 over electrode material 160.

As an example, patterned interconnect layer 120 can comprise copper, including, in one embodiment, damascene copper. Patterned interconnect layer 120 can also comprise aluminum or another conductive material as known in the art. In one embodiment, patterned interconnect layer 120 can comprise a portion 121 and a portion 122 separated from portion 121 by a gap 123. In at least one embodiment, gap 123 represents a region of silicon dioxide, a region of silicon-dioxide-based material, or a region of material having a low dielectric constant.

As another example, dielectric material 130 can comprise silicon nitride or another dielectric material not containing oxygen. In a particular embodiment, dielectric material 130 comprises plasma-enhanced nitride (PEN).

As still another example, dielectric material 150 can comprise a material or a combination of materials having an effective dielectric constant greater than approximately eight, and preferably greater than approximately twenty. In one embodiment, dielectric material 150 comprises a stack comprising a first layer of hafnium oxide, a layer of tantalum oxide above the first layer of hafnium oxide, and a second layer of hafnium oxide above the layer of tantalum oxide. In other embodiments, dielectric material 150 can comprise zirconium oxide, aluminum oxide, titanium oxide, barium-strontium-titanate (BST), silicon nitride (including PEN).

In further embodiments, dielectric material 150 can comprise a laminate structure in which multiple layers of any of the foregoing materials, or other similar materials not mentioned herein, are stacked one above another. In these further embodiments, the particular layers of the laminate structure that are to contact an adjacent material, such as an electrode material, are chosen so as to be compatible with that adjacent material. In this context, compatibility means compatibility in terms of material adhesion properties, chemical and electrical interaction properties, and the like. As an example, tantalum oxide cannot be placed directly on top of copper because the tantalum oxide will oxidize the copper. As another example, tantalum oxide cannot be placed directly on top of tantalum nitride because the oxygen will diffuse into the tantalum nitride and the nitrogen will diffuse into the tantalum oxide, thus negatively affecting the electric properties of the electrode material and the dielectric properties of the dielectric material, respectively. Hafnium oxide, in contrast, does not exhibit an unwanted reaction with tantalum nitride.

In still further embodiments, dielectric material 150 can comprise a mixture in which any of a variety of combinations of any of the foregoing materials, or other similar materials not mentioned herein, in any of a variety of proportions, are mixed together to form a layer or layers of dielectric material.

As yet another example, electrode material 140 can comprise tantalum nitride, titanium nitride, tantalum, tungsten-based metals, nickel-based metals, other refractory metals, and similar materials. As further discussed below, a portion of electrode material 140 may be used, in certain embodiments of the invention, as a resistor, while, in certain embodiments of the invention, no portion of electrode material 160 is used as a resistor. Accordingly, electrode material 160 can comprise any of the materials listed above for electrode material 140, and can also comprise more highly-conductive materials such as copper, aluminum, gold, and the like.

Dielectric material 170 can be similar in composition to dielectric material 130, and can also comprise, for example, amorphous carbon. Dielectric material 170, in at least one embodiment, serves no electrical function, but can act as an etch stop for a via etch, and/or as a hard mask during the subsequent patterning of electrode material 160. In addition to serving as the insulator in a MIM capacitor, dielectric materials 150 and 130 can also serve as etch stops, and dielectric material 150 can further serve as a hard mask, during the subsequent patterning of electrode material 160.

Figure 2:
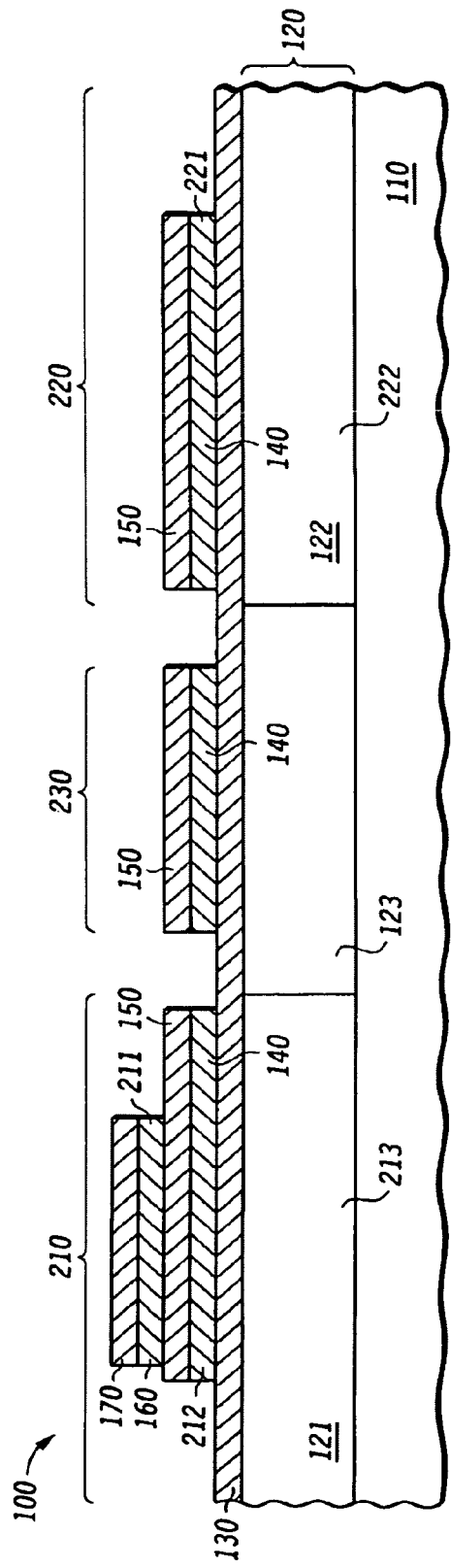
FIG. 2 is a cross-sectional view of a portion of the semiconductor device of FIG. 1 at a later stage of the manufacturing process according to an embodiment of the invention.

FIG. 2 is a cross-sectional view of a portion of semiconductor device 100 at a later stage of the manufacturing process according to an embodiment of the invention. As illustrated in FIG. 2, dielectric material 170 and electrode material 160 have been patterned to form an electrode 211 of a capacitor 210. As further illustrated in FIG. 2, dielectric material 150 and electrode material 140 have been patterned to form an electrode 221 of a capacitor 220, to form an electrode 212 of capacitor 210, and to define a resistor 230. At least portions of capacitors 210 and 220 and resistor 230 are formed above patterned interconnect layer 120.

In one embodiment of the invention, portion 121 of patterned interconnect layer 120 forms an electrode 213 of capacitor 210. In the same or another embodiment, portion 122 of patterned interconnect layer 120 forms an electrode 222 of capacitor 220.

As an example, electrode 211 can be a top electrode of capacitor 210, electrode 212 can be a middle electrode of capacitor 210, and electrode 213 can be a bottom electrode of capacitor 210. As another example, electrode 221 can be a top electrode of capacitor 220 and electrode 222 can be a bottom electrode of capacitor 220.

In one embodiment, capacitor 210 can have a high capacitive density. In other words, capacitor 210 can have a high capacitance per unit area, defined herein as a capacitance per unit area (C/A) equal to or greater than approximately 4 femto-Farads per square micrometer ($fF/\mu m^2$). In the same or another embodiment, capacitor 220 can have a lower capacitance per unit area but a higher quality than capacitor 210. As an example, capacitor 220 can have a C/A of approximately 1.6 $fF/\mu m^2$. Capacitor 220 can have a higher quality than capacitor 210 in part because capacitor 220 contains dielectric materials that perform better with respect to, for example, leakage current, linearity, and/or reliability than at least some of the materials that make up capacitor 210. In at least one embodiment, differences in the dielectric materials that form a part of capacitors 210 and 220 also contribute to the differences in quality and capacitance per unit area between capacitors 210 and 220. Accordingly, in this at least one embodiment, at least one of the dielectric layers of capacitor 210 comprises a material that is different from a material of at least one of the dielectric layers of capacitor 220. Specific examples of some acceptable dielectric materials for capacitors 210 and 220 were given above.

As an example, capacitor 220 can have one or more of a high linearity, a low TCC, and a low leakage material, making capacitor 220 a high performance capacitor. Resistor 230 can be, for example, a high performance thin film resistor.

Because both capacitor 210 and capacitor 220 are located on or over semiconductor substrate 110, semiconductor device 100 offers greater performance flexibility than would a semiconductor device having only a single capacitor, whether the single capacitor had a high capacitive density or high linearity, low TCC, or low leakage. As just one example, a semiconductor device such as semiconductor device 100 may be useful in communication systems, both wireless and wire based.

Figure 3:
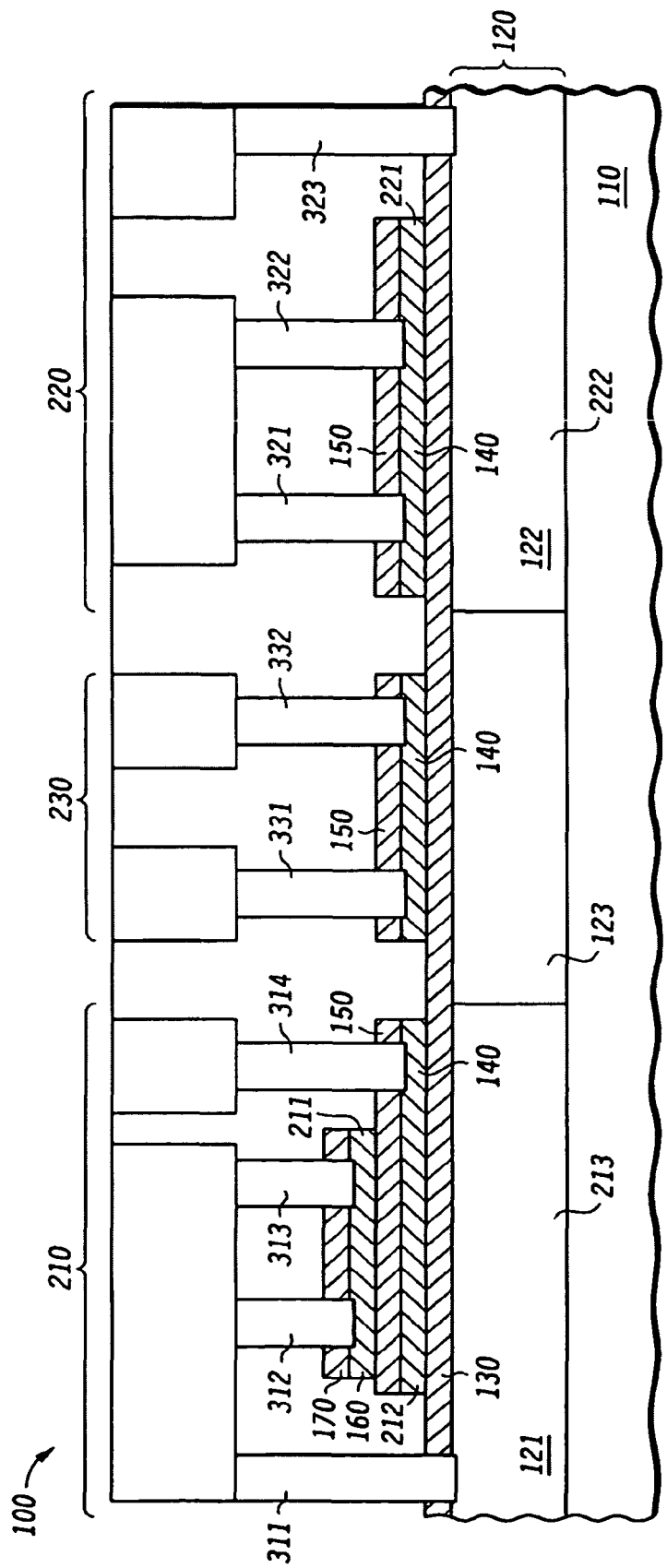
FIG. 3 is a cross-sectional view of a portion of the semiconductor device of FIG. 2 at a later stage of the manufacturing process according to an embodiment of the invention.

FIG. 3 is a cross-sectional view of a portion of semiconductor device 100 at a later stage of the manufacturing process according to an embodiment of the invention. As illustrated in FIG. 3, an electrical contact 311 has been coupled to electrode 213 of capacitor 210, electrical contacts 312 and 313 have been coupled to electrode 211 of capacitor 210, and electrical contact 314 has been coupled to electrode 212 of capacitor 210. As further illustrated in FIG. 3, electrical contacts 321 and 322 have been coupled to electrode 221 of capacitor 220, an electrical contact 323 has been coupled to electrode 222 of capacitor 220, and electrical contacts 331 and 332 have been coupled to resistor 230. As known in the art, resistor 230 could, in certain embodiments, be coupled to further electrical contacts in addition to the two electrical contacts 331 and 332 illustrated in FIG. 3. Similarly, electrodes 211, 212, and 213 of capacitor 210 and electrodes 221 and 222 of capacitor 220 could be coupled to further electrical contacts in addition to the one or two electrical contacts illustrated in FIG. 3 to be coupled to electrodes 211, 212, 213, 221, and 222.

In the illustrated embodiment, capacitor 210 comprises a stacked capacitor having two MIM capacitors wired in parallel. With multiple MIM capacitors wired in parallel, capacitor 210 potentially has a higher C/A than a non-stacked capacitor, but would possibly be of lower quality than the non-stacked capacitor because of the lower quality of the dielectric materials of the stacked capacitor.

In one embodiment, at least electrical contacts 311, 312, 313, 314, 321, 322, and 323 are formed substantially simultaneously with each other. In a non-illustrated embodiment, at least electrical contacts 312, 313, 314, 321, 322, and 323 are formed substantially simultaneously with each other, but electrical contact 311 is not formed. In that non-illustrated embodiment, electrode 213 of capacitor 210 would be electrically connected through portion 121 to another portion of the integrated circuit. It will be recognized by one of ordinary skill in the art that portion 121 can, but does not necessarily, extend underneath all of electrodes 211 or 212. Similarly, portion 122 can, but does not necessarily, extend underneath all of electrode 221. Furthermore, portions 121 and 122 are not necessarily continuous underneath electrodes 211, 212, and 221.

Figure 4:
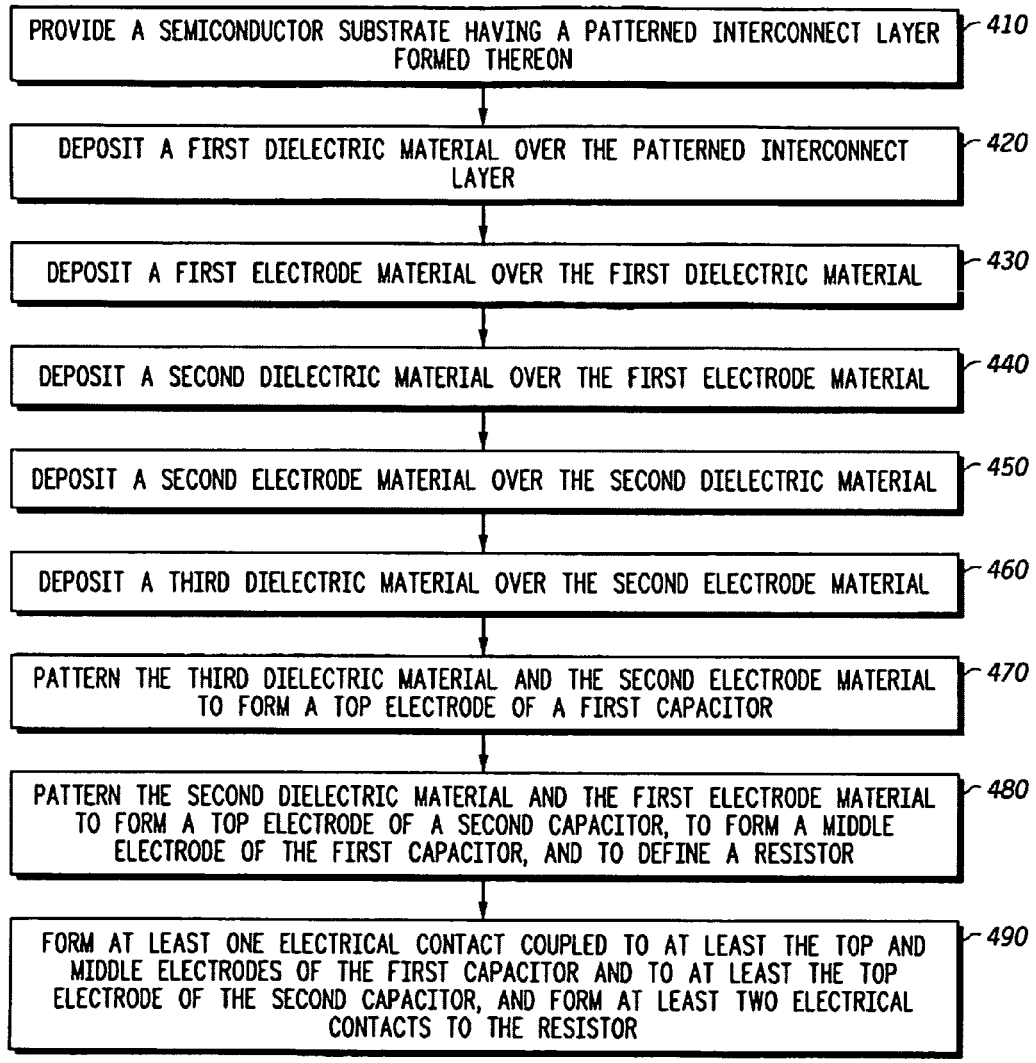
FIG. 4 is a flowchart illustrating a method of making the semiconductor device of FIGS. 1-3 according to an embodiment of the invention.

FIG. 4 is a flowchart illustrating a method 400 of making semiconductor device 100 according to an embodiment of the invention. Method 400 comprises, among other steps, two patterning steps, indicating that method 400 is a two-mask manufacturing method integrating a one-mask and a two-mask MIM capacitor with a resistor on a single integrated circuit. It will be understood by one of ordinary skill in the art that the two masks referred to in the preceding sentence are the masks required to form a MIM capacitor in accordance with an embodiment of the invention, and that additional masks may be required to form other portions of the integrated circuit, such as, for example, the patterned interconnect layer, the upper interconnect structure, optional layers not required to form the basic MIM capacitor structure, and the like.

A step 410 of method 400 is to provide a semiconductor substrate having a patterned interconnect layer formed thereon. As an example, the semiconductor substrate can be similar to semiconductor substrate 110, first shown in FIG. 1, and the patterned interconnect layer can be similar to patterned interconnect layer 120, also first shown in FIG. 1.

A step 420 of method 400 is to deposit a first dielectric material over the patterned interconnect layer. As an example, the first dielectric material can be similar to dielectric material 130, first shown in FIG. 1.

A step 430 of method 400 is to deposit a first electrode material over the first dielectric material. As an example, the first electrode material can be similar to electrode material 140, first shown in FIG. 1.

A step 440 of method 400 is to deposit a second dielectric material over the first electrode material. As an example, the second dielectric material can be similar to dielectric material 150, first shown in FIG. 1.

A step 450 of method 400 is to deposit a second electrode material over the second dielectric material. As an example, the second electrode material can be similar to electrode material 160, first shown in FIG. 1.

A step 460 of method 400 is to deposit a third dielectric material over the second electrode material. As an example, the third dielectric material can be similar to dielectric material 170, first shown in FIG. 1.

A step 470 of method 400 is to pattern the third dielectric material and the second electrode material, using a first mask, to form a top electrode of a first capacitor. As an example, the first capacitor can be similar to capacitor 210, first shown in FIG. 2, and the top electrode of the first capacitor can be similar to electrode 211, also first shown in FIG. 2.

A step 480 of method 400 is to pattern the second dielectric material and the first electrode material, using a second mask, to form a top electrode of a second capacitor, to form a middle electrode of the first capacitor, and to define a resistor. As an example, the second capacitor can be similar to capacitor 220, the top electrode of the second capacitor can be similar to electrode 221, the middle electrode can be similar to electrode 212, and the resistor can be similar to resistor 230, all of which are first shown in FIG. 2.

A step 490 of method 400 is to form at least one electrical contact coupled to at least the top and middle electrodes of the first capacitor and to at least the top electrode of the second capacitor, and to form at least two electrical contacts to the resistor. As an example, the electrical contacts can be similar to one or more of electrical contacts 311, 312, 313, 314, 321, 322, 323, 331, and 332, all of which were first shown in FIG. 3. In one embodiment of method 400, step 480 comprises forming the electrical contacts simultaneously with each other.

In one embodiment of method 400, the patterned interconnect layer forms a bottom electrode of the second capacitor and is absent from the first capacitor. In a different embodiment of method 400, the patterned interconnect layer forms a bottom electrode of the first capacitor and a bottom electrode of the second capacitor. In that different embodiment of method 400, the electrode of the first capacitor comprises a middle electrode of the first capacitor, and the middle electrode of the first capacitor is located between the top electrode of the first capacitor and the bottom electrode of the first capacitor.

FIG. 5 is a cross-sectional view of a portion of a semiconductor device 500 at a particular stage in a manufacturing process according to an embodiment of the invention. As illustrated in FIG. 5, semiconductor device 500 comprises a semiconductor substrate 510, a patterned interconnect layer 520 above semiconductor substrate 510, a dielectric material 530 over patterned interconnect layer 520, an electrode material 540 over dielectric material 530, a dielectric material 550 over electrode material 540, an electrode material 560 over dielectric material 550, and a dielectric material 570 over electrode material 560. As an example, semiconductor substrate 510, patterned interconnect layer 520, dielectric material 530, electrode material 540, dielectric material 550, electrode material 560, and dielectric material 570 can be similar to semiconductor substrate 110, patterned interconnect layer 120, dielectric material 130, electrode material 140, dielectric material 150, electrode material 160, and dielectric material 170, respectively, first shown in FIG. 1. In the illustrated embodiment, patterned interconnect layer 520 comprises a portion 521 and a portion 522 separated from portion 521 by a gap 523. Portion 521, portion 522, and gap 523 can be similar to, respectively, portion 121, portion 122, and gap 123, first shown in FIG. 1.

As further illustrated in FIG. 5, dielectric material 530 has been patterned to form an opening 531 that exposes a portion 525 of patterned interconnect layer 520, and electrode material 540 has been deposited over dielectric material 530 and within opening 531 such that electrode material 540 physically and electrically contacts, or is coupled to, portion 525 of patterned interconnect layer 520.

FIG. 6 is a cross-sectional view of a portion of semiconductor device 500 at a later stage of the manufacturing process according to an embodiment of the invention. As illustrated in FIG. 6, dielectric material 570 and electrode material 560 have been patterned to form an electrode 611. As an example, electrode 611 can be similar to electrode 211, first shown in FIG. 2.

Figure 7:
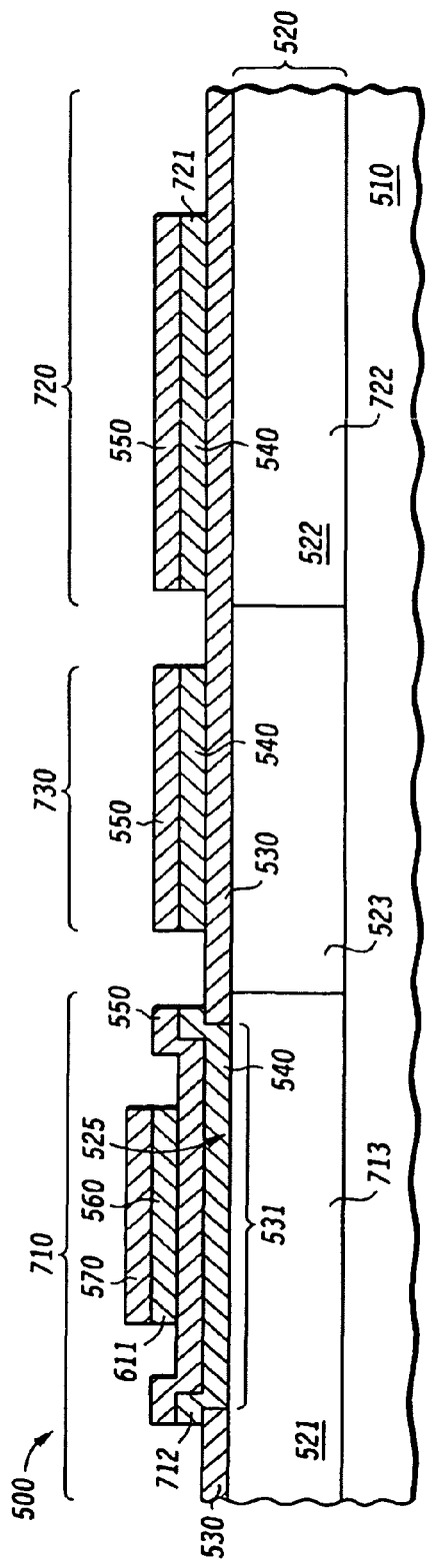
FIG. 7 is a cross-sectional view of the semiconductor device of FIG. 6 at a later stage of the manufacturing process according to an embodiment of the invention.

FIG. 7 is a cross-sectional view of semiconductor device 500 at a later stage of the manufacturing process according to an embodiment of the invention. As illustrated in FIG. 7, electrode 611 is an electrode of a capacitor 710. As further illustrated in FIG. 7, dielectric material 550 and electrode material 540 have been patterned to form an electrode 721 of a capacitor 720, to form an electrode 712 of capacitor 710, and to define a resistor 730. At least portions of capacitors 710 and 720 and resistor 730 are formed above patterned interconnect layer 520. As an example, electrode 721 and resistor 730 can be similar to, respectively, electrode 221 and resistor 230, both of which were first shown in FIG. 2. As another example, capacitor 710 can be similar to capacitor 210, first shown in FIG. 2, in that capacitor 710, like capacitor 210, can have a high capacitive density. As still another example, capacitor 720 can be similar to capacitor 220, first shown in FIG. 2, in that capacitor 720 can have a higher quality than capacitor 710, just as capacitor 220 can have a higher quality than capacitor 210.

In one embodiment of the invention, portion 521 of patterned interconnect layer 520 forms an electrode 713 of capacitor 710. In that embodiment, electrode 713 and electrode 712 form a bottom electrode of capacitor 710. In a different embodiment, where portion 521 does not form electrode 713, electrode 712 forms a bottom electrode of capacitor 710. In the same or another embodiment, portion 522 of patterned interconnect layer 520 forms an electrode 722 of capacitor 720.

Figure 8:
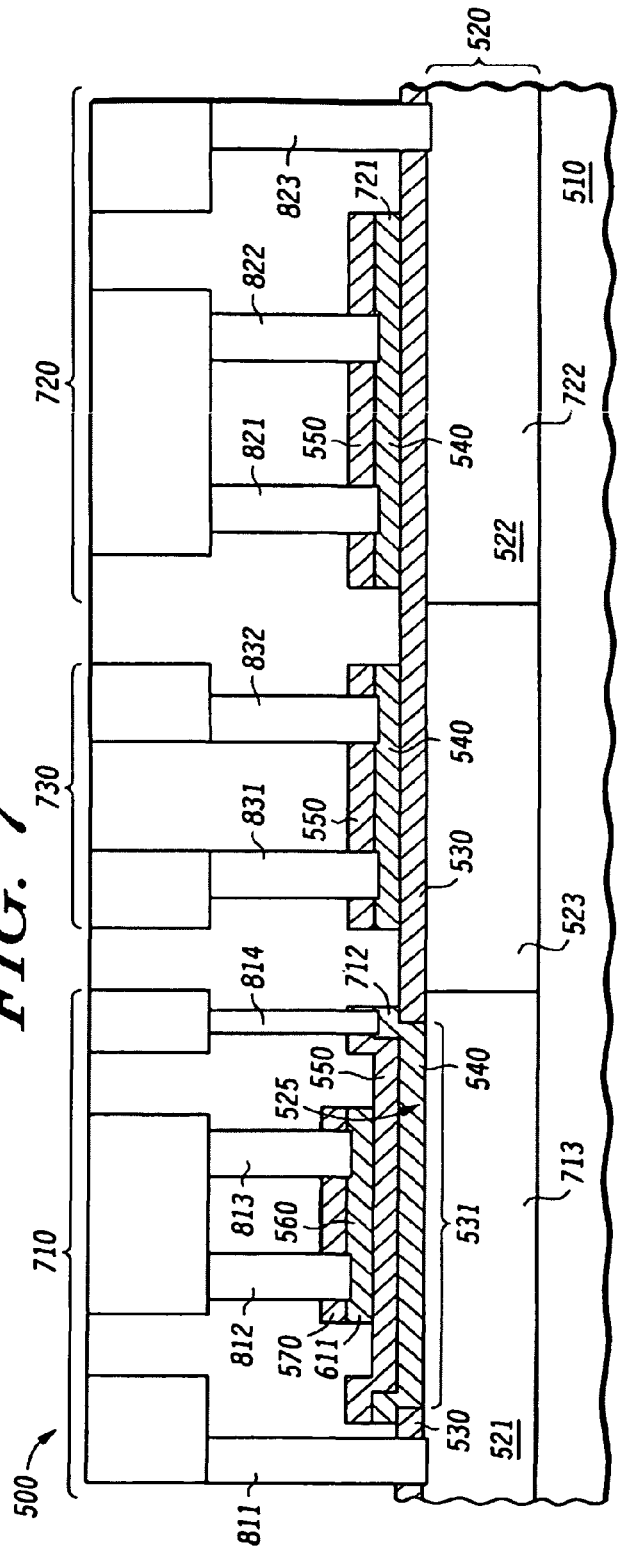
FIG. 8 is a cross-sectional view of a portion of the semiconductor device of FIG. 7 at a later stage of the manufacturing process according to an embodiment of the invention.

FIG. 8 is a cross-sectional view of a portion of semiconductor device 500 at a later stage of the manufacturing process according to an embodiment of the invention. As illustrated in FIG. 8, an electrical contact 811 has been coupled to electrode 713 of capacitor 710, electrical contacts 812 and 813 have been coupled to electrode 611 of capacitor 710, and electrical contact 814 has been coupled to electrode 712 of capacitor 710. It will be understood by one of ordinary skill in the art that electrical contact 814 would be formed only in those embodiments where portion 521 of patterned interconnect layer 520 is absent. In embodiments where portion 521 is present, electrical contact to electrode 712 is accomplished via portion 521.

As further illustrated in FIG. 8, electrical contacts 821 and 822 have been coupled to electrode 721 of capacitor 720, an electrical contact 823 has been coupled to electrode 722 of capacitor 720, and electrical contacts 831 and 832 have been coupled to resistor 730. As known in the art, resistor 730 could, in certain embodiments, be coupled to further electrical contacts in addition to the two electrical contacts 831 and 832 illustrated in FIG. 8. Similarly, electrodes 611, 712, and 713 of capacitor 710 and electrodes 721 and 722 of capacitor 720 could be coupled to further electrical contacts in addition to the one or two electrical contacts illustrated in FIG. 8 to be coupled to electrodes 611, 712, 713, 721, and 722.

In one embodiment, at least electrical contacts 811, 812, 813, 814, 821, 822, and 823 are formed substantially simultaneously with each other. In a non-illustrated embodiment, at least electrical contacts 812, 813, 814, 821, and 822 are formed substantially simultaneously with each other, but electrical contact 811 and/or electrical contact 823 are not formed. In that non-illustrated embodiment, electrode 713 of capacitor 710 and/or electrode 722 of capacitor 720 would be electrically connected through portion 521 and portion 522, respectively, to another portion of the integrated circuit.

Figure 9:
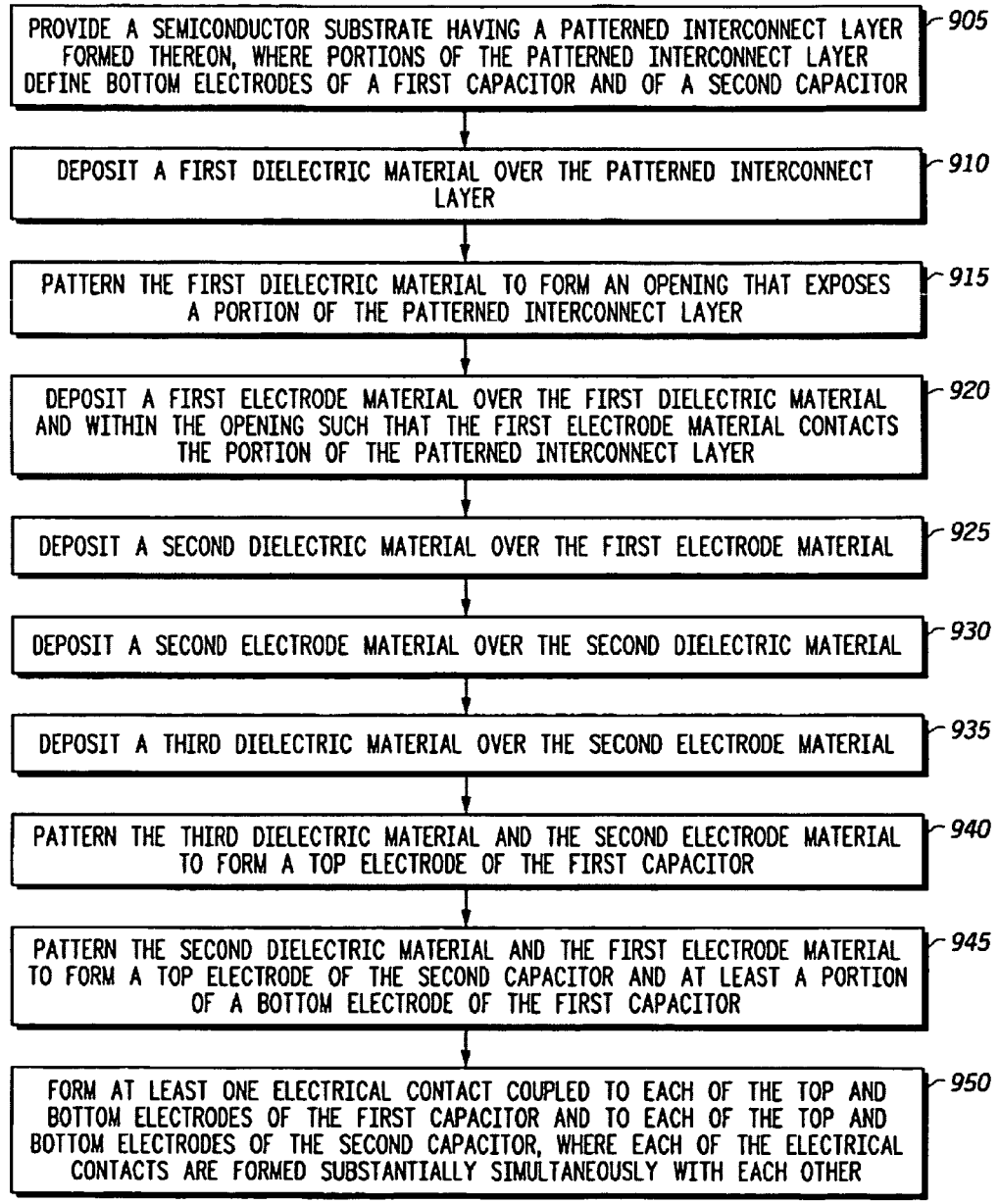
FIG. 9 is a flowchart illustrating a method of making the semiconductor device of FIGS. 5-8 according to an embodiment of the invention.

FIG. 9 is a flowchart illustrating a method 900 of making semiconductor device 500 according to an embodiment of the invention. Method 900 comprises, among other steps, three patterning steps, indicating that method 900 is a three-mask manufacturing method integrating a one-mask and a three-mask MIM capacitor with a resistor on a single integrated circuit. It will be understood by one of ordinary skill in the art that the three masks referred to in the preceding sentence are the masks required to form a MIM capacitor in accordance with an embodiment of the invention, and that additional masks may be required to form other portions of the integrated circuit, such as, for example, the patterned interconnect layer, the upper interconnect structure, optional layers not required to form the basic MIM capacitor structure, and the like.

A step 905 of method 900 is to provide a semiconductor substrate having a patterned interconnect layer formed thereon, where portions of the patterned interconnect layer define bottom electrodes of a first capacitor and of a second capacitor. As an example, the semiconductor substrate can be similar to semiconductor substrate 510, first shown in FIG. 5, and the patterned interconnect layer can be similar to patterned interconnect layer 520, also first shown in FIG. 5. As another example, the first capacitor can be similar to capacitor 710, first shown in FIG. 7, and the second capacitor can be similar to capacitor 720, also first shown in FIG. 7. As still another example, the portions of the patterned interconnect layer defining bottom electrodes of the first and second capacitors can be similar to portions 521 and 522, first shown in FIG. 5.

A step 910 of method 900 is to deposit a first dielectric material over the patterned interconnect layer. As an example, the first dielectric material can be similar to dielectric material 530, first shown in FIG. 5.

A step 915 of method 900 is to pattern the first dielectric material, using a first mask, to form an opening that exposes a portion of the patterned interconnect layer. As an example, the opening can be similar to opening 531, and the exposed portion of the patterned interconnect layer can be similar to portion 525, both of which are first shown in FIG. 5.

A step 920 of method 900 is to deposit a first electrode material over the first dielectric material and within the opening such that the first electrode material contacts the portion of the patterned interconnect layer. As an example, the first electrode material can be similar to electrode material 540, first shown in FIG. 5.

A step 925 of method 900 is to deposit a second dielectric material over the first electrode material. As an example, the second dielectric material can be similar to dielectric material 550, first shown in FIG. 5.

A step 930 of method 900 is to deposit a second electrode material over the second dielectric material. As an example, the second electrode material can be similar to electrode material 560, first shown in FIG. 5.

A step 935 of method 900 is to deposit a third dielectric material over the second electrode material. As an example, the third dielectric material can be similar to dielectric material 570, first shown in FIG. 5.

A step 940 of method 900 is to pattern the third dielectric material and the second electrode material, using a second mask, to form a top electrode of the first capacitor. As an example, the top electrode of the first capacitor can be similar to electrode 611, first shown in FIG. 6.

A step 945 of method 900 is to pattern the second dielectric material and the first electrode material, using a third mask, to form a top electrode of the second capacitor and at least a portion of a bottom electrode of the first capacitor. As an example, the top electrode of the second capacitor can be similar to electrode 721, first shown in FIG. 7, and the bottom electrode, or portion of the bottom electrode, of the first capacitor can be similar to electrode 712, first shown in FIG. 7. In one embodiment, step 945 can further comprise forming a resistor. As an example, the resistor can be similar to resistor 730, first shown in FIG. 7.

A step 950 of method 900 is to form at least one electrical contact coupled to each of the top and bottom electrodes of the first capacitor and to each of the top and bottom electrodes of the second capacitor, where each of the electrical contacts are formed substantially simultaneously with each other. In another embodiment, step 950 can comprise forming electrical contacts coupled to each of the top electrode of the first capacitor and to each of the top and bottom electrodes of the second capacitor, but not to the bottom electrode of the first capacitor. In that other embodiment, electrode 713 of capacitor 710 would be electrically connected through portion 521 to another portion of the integrated circuit. In still other embodiments, step 950 can comprise forming electrical contacts to the top electrode of the first capacitor and to the top electrode of the second capacitor, but: (1) not to the bottom electrode of the first capacitor or to the bottom electrode of the second capacitor; and/or (2) not to the bottom electrode of the second capacitor. In those other embodiments, electrode 713 of capacitor 710 and/or electrode 722 of capacitor 720 would be electrically connected through portions 521 and 522, respectively, to another portion of the integrated circuit.

In an embodiment of method 900 in which a resistor is formed, step 950 or another step can further comprise forming electrical contacts to the resistor. As an example, the electrical contacts can be similar to one or more of electrical contacts 811, 812, 813, 814, 821, 822, 823, 831, and 832, all of which were first shown in FIG. 8.

Figure 10:
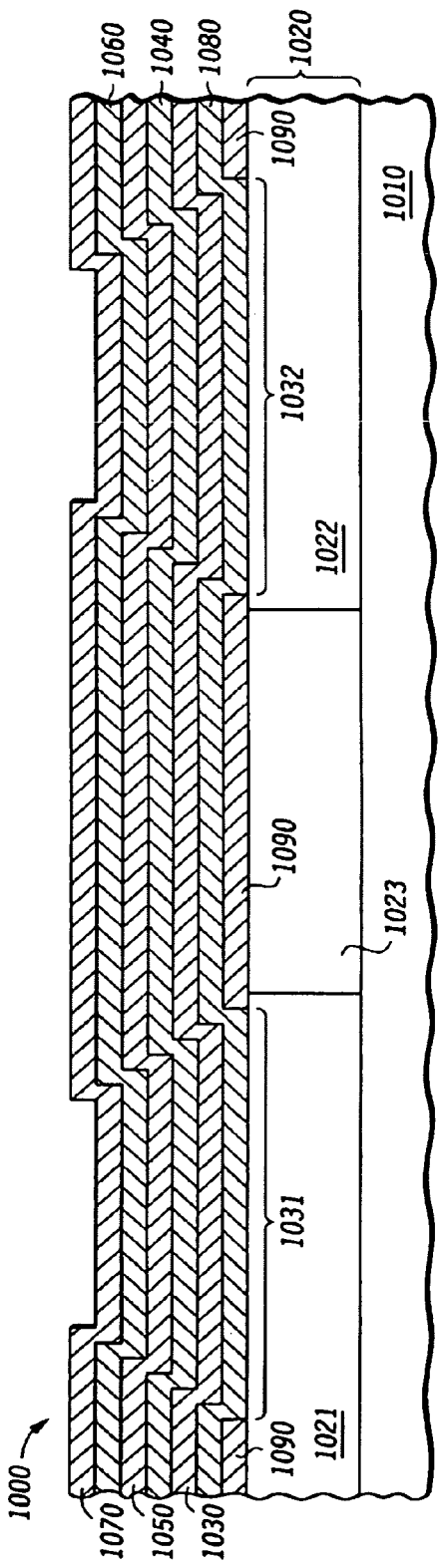
FIG. 10 is a cross-sectional view of a portion of another semiconductor device at a particular stage in a manufacturing process according to an embodiment of the invention.

FIG. 10 is a cross-sectional view of a portion of a semiconductor device 1000 at a particular stage of a manufacturing process according to an embodiment of the invention. As illustrated in FIG. 10, semiconductor device 1000 comprises a semiconductor substrate 1010, a patterned interconnect layer 1020 formed on semiconductor substrate 1010, a dielectric material 1090 over patterned interconnect layer 1020, an electrode material 1080 over dielectric material 1090, a dielectric material 1030 over electrode material 1080, an electrode material 1040 over dielectric material 1030, a dielectric material 1050 over electrode material 1040, an electrode material 1060 over dielectric material 1050, and a dielectric material 1070 over electrode material 1060.

As an example, semiconductor substrate 1010, patterned interconnect layer 1020, dielectric material 1030, electrode material 1040, dielectric material 1050, electrode material 1060, and dielectric material 1070 can be similar to semiconductor substrate 110, patterned interconnect layer 120, dielectric material 130, electrode material 140, dielectric material 150, electrode material 160, and dielectric material 170, respectively, first shown in FIG. 1. As a further example, electrode material 1080 can be similar to electrode material 140 and dielectric material 1090 can be similar to dielectric material 130, both of which are first shown in FIG. 1.

In the illustrated embodiment, patterned interconnect layer 1020 comprises a portion 1021 and a portion 1022 separated from portion 1021 by a gap 1023. Portion 1021, portion 1022, and gap 1023 can be similar to, respectively, portion 121, portion 122, and gap 123, first shown in FIG. 1.

As further illustrated in FIG. 10, dielectric material 1090 has been patterned to form an opening 1031 and an opening 1032 that expose portions of patterned interconnect layer 1020, and electrode material 1080 has been deposited over dielectric material 1090 and within openings 1031 and 1032 such that electrode material 1080 physically and electrically contacts, or is coupled to, the exposed portions of patterned interconnect layer 1020.

Figure 11:
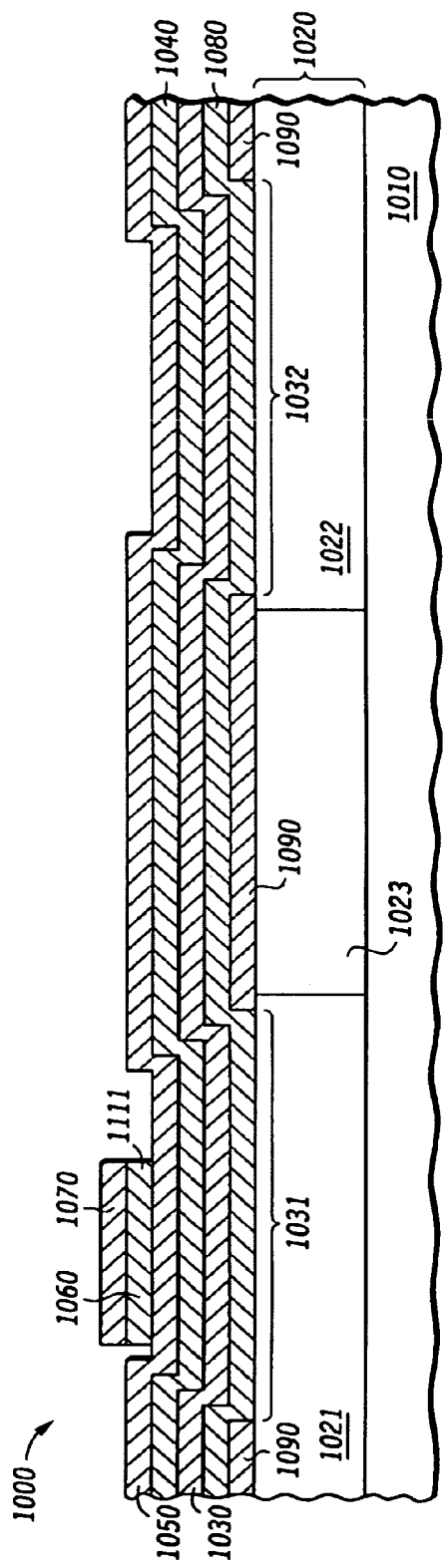
FIG. 11 is a cross-sectional view of a portion of the semiconductor device of FIG. 10 at a later stage of the manufacturing process according to an embodiment of the invention.

FIG. 11 is a cross-sectional view of a portion of semiconductor device 1000 at a later stage of the manufacturing process according to an embodiment of the invention. As illustrated in FIG. 1, dielectric material 1070 and electrode material 1060 have been patterned to form an electrode 1111. As an example, electrode 1111 can be similar to electrode 211, first shown in FIG. 2.

Figure 12:
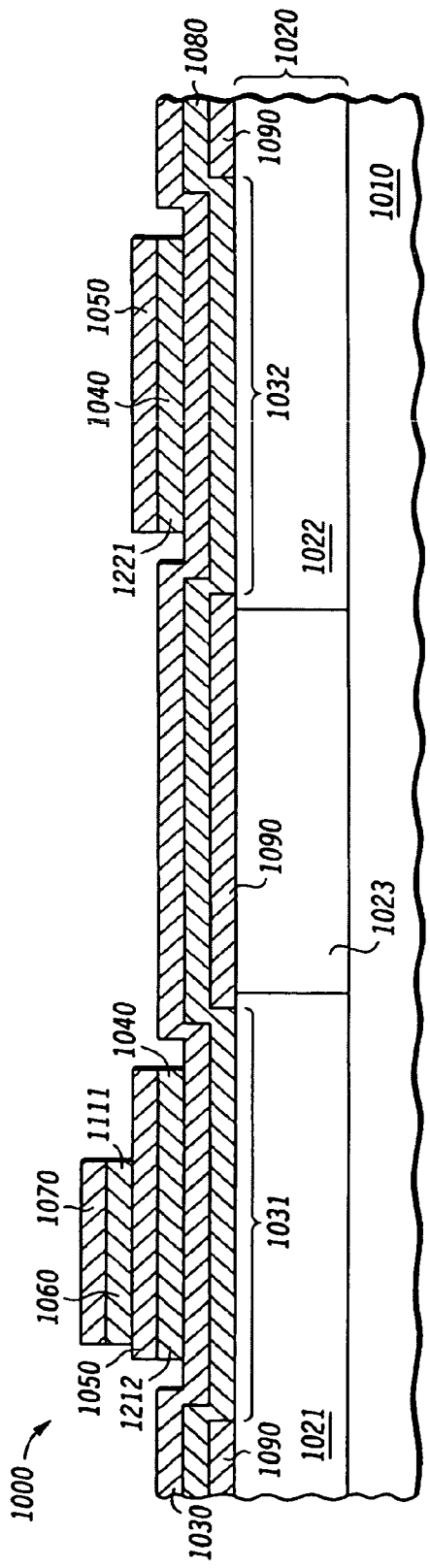
FIG. 12 is a cross-sectional view of the semiconductor device of FIG. 11 at a later stage of the manufacturing process according to an embodiment of the invention.

FIG. 12 is a cross-sectional view of semiconductor device 1000 at a later stage of the manufacturing process according to an embodiment of the invention. As illustrated in FIG. 12, dielectric material 1050 and electrode material 1040 have been patterned to form an electrode 1212 and an electrode 1221. As an example, electrode 1221 can be similar to electrode 721, first shown in FIG. 7.

Figure 13:
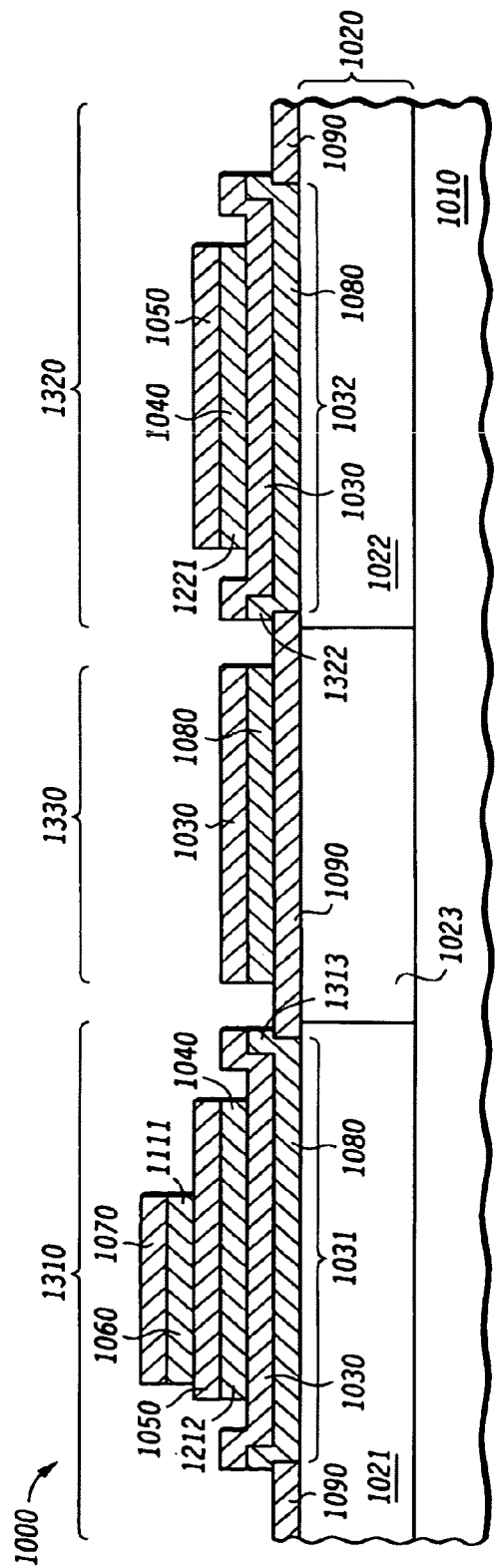
FIG. 13 is a cross-sectional view of a portion of the semiconductor device of FIG. 12 at a later stage of the manufacturing process according to an embodiment of the invention.

FIG. 13 is a cross-sectional view of a portion of semiconductor device 1000 at a later stage of the manufacturing process according to an embodiment of the invention. As illustrated in FIG. 13, electrodes 1111 and 1212 are electrodes of a capacitor 1310. As further illustrated in FIG. 13, electrode 1221 is an electrode of a capacitor 1320. As still further illustrated in FIG. 13, dielectric material 1030 and electrode material 1080 have been patterned to form an electrode 1313 of capacitor 1310, an electrode 1322 of capacitor 1320, and a resistor 1330. At least portions of capacitors 1310 and 1320 and resistor 1330 are formed above patterned interconnect layer 1020. As an example, electrode 1212 and electrode 1221 can be similar to, respectively, electrode 212 and electrode 221, both of which were first shown in FIG. 2. As another example, capacitor 1310 can be similar to capacitor 210, first shown in FIG. 2, in that capacitor 1310, like capacitor 210, can have a high capacitive density. As still another example, capacitor 1320 can be similar to capacitor 220, first shown in FIG. 2, in that capacitor 1320 can have a higher quality than capacitor 1310, just as capacitor 220 can have a higher quality than capacitor 210.

Figure 14:
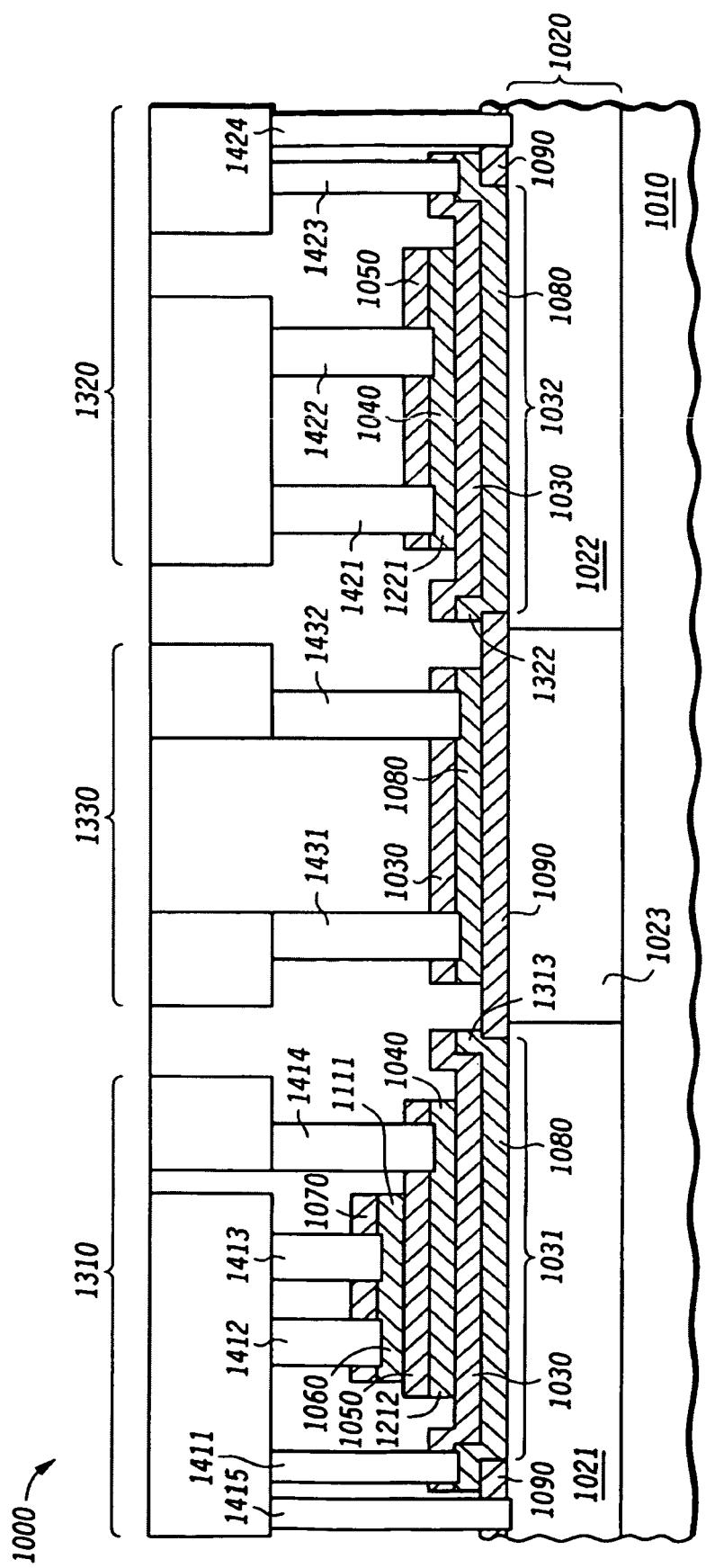
FIG. 14 is a cross-sectional view of a portion of the semiconductor device of FIG. 13 at a later stage of the manufacturing process according to an embodiment of the invention.

FIG. 14 is a cross-sectional view of a portion of semiconductor device 1000 at a later stage of the manufacturing process according to an embodiment of the invention. As illustrated in FIG. 14, an electrical contact 1411 has been coupled to electrode 1313 of capacitor 1310, electrical contacts 1412 and 1413 have been coupled to electrode 1111 of capacitor 1310, an electrical contact 1414 has been coupled to electrode 1212 of capacitor 1310, and an electrical contact 1415 has been coupled to portion 1021 of patterned interconnect layer 1020. As further illustrated in FIG. 14, electrical contacts 1421 and 1422 have been coupled to electrode 1221 of capacitor 1320, an electrical contact 1423 has been coupled to electrode 1322 of capacitor 1320, an electrical contact 1424 has been coupled to portion 1022 of patterned interconnect layer 1020, and electrical contacts 1431 and 1432 have been coupled to resistor 1330.

Electrical contact to electrode 1313 of capacitor 1310 may be accomplished using any of a variety of methods. As an example, electrical contact to electrode 1313 may be accomplished via electrical contact 1411 alone, electrical contact 1415 alone, or portion 1021 of patterned interconnect layer 1020 alone. As another example, electrical contact to electrode 1313 may be accomplished via any two of electrical contacts 1411 and 1415 and portion 1021 of patterned interconnect layer 1020, i.e., via electrical contacts 1411 and 1415, via electrical contact 1411 and portion 1021, or via electrical contact 1415 and portion 1021. As still another example, electrical contact to electrode 1313 may be accomplished via all three of electrical contacts 1411 and 1415 and portion 1021 of patterned interconnect layer 1020 simultaneously. Similarly, electrical contact to electrode 1322 of capacitor 1320 may be accomplished in a variety of ways. As an example, electrical contact to electrode 1322 may be accomplished via electrical contact 1423 alone, electrical contact 1424 alone, or portion 1022 of patterned interconnect layer 1020 alone. As another example, electrical contact to electrode 1322 may be accomplished via any two of electrical contacts 1423 and 1424 and portion 1022 of patterned interconnect layer 1020, i.e., via electrical contacts 1423 and 1424, via electrical contact 1423 and portion 1022, or via electrical contact 1424 and portion 1022. As still another example, electrical contact to electrode 1322 may be accomplished via all three of electrical contacts 1423 and 1424 and portion 1022 of patterned interconnect layer 1020 simultaneously.

It will be understood by one of ordinary skill in the art that a particular electrical contact method used for one of capacitors 1310 and 1320 does not necessarily affect an electrical contact method used for the other one of capacitors 1310 and 1320. Instead, any of the above-mentioned electrical contact methods is possible for either capacitor, without regard to the particular electrical contact method selected for the other capacitor.

As known in the art, resistor 1330 could, in certain embodiments, be coupled to further electrical contacts in addition to the two electrical contacts 1431 and 1432 illustrated in FIG. 14. Similarly, electrodes 1111, 1212, and 1313 of capacitor 1310 and electrodes 1221 and 1322 of capacitor 1320 could be coupled to further electrical contacts in addition to the one or two electrical contacts illustrated in FIG. 14 to be coupled to electrodes 1111, 1212, 1313, 1221, and 1322. In the illustrated embodiment, capacitor 1310, like capacitor 210, comprises a stacked capacitor having two MIM capacitors wired in parallel.

In one embodiment, at least electrical contacts 1411, 1412, 1413, 1414, 1421, 1422, and 1423 are formed substantially simultaneously with each other. In a non-illustrated embodiment, at least electrical contacts 1412, 1413, 1414, 1421, 1422, and 1423 are formed substantially simultaneously with each other, but electrical contact 1411 is not formed. In that non-illustrated embodiment, electrode 1313 of capacitor 1310 would be electrically connected through portion 1021 to another portion of the integrated circuit.

Figure 15:
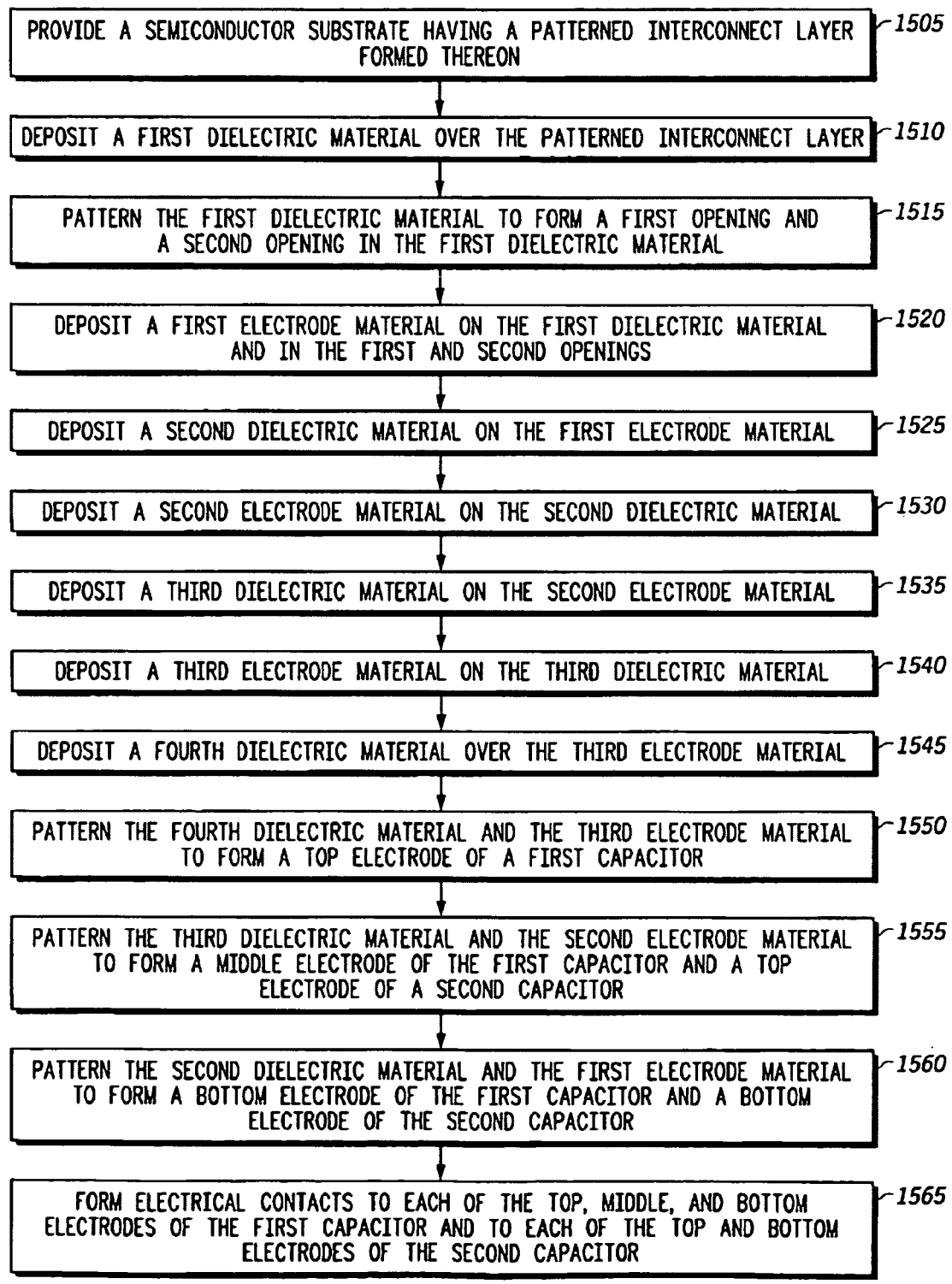
FIG. 15 is a flowchart illustrating a method of making the semiconductor device of FIGS. 10-14 according to an embodiment of the invention.

FIG. 15 is a flowchart illustrating a method 1500 of making semiconductor device 1000 according to an embodiment of the invention. Method 1500 comprises, among other steps, four patterning steps, indicating that method 1500 is a four-mask manufacturing method integrating a two-mask and a three-mask MIM capacitor with a resistor on a single integrated circuit. It will be understood by one of ordinary skill in the art that the four masks referred to in the preceding sentence are the masks required to form a MIM capacitor in accordance with an embodiment of the invention, and that additional masks may be required to form other portions of the integrated circuit, such as, for example, the patterned interconnect layer, the upper interconnect structure, optional layers not required to form the basic MIM capacitor structure, and the like.

A step 1505 of method 1500 is to provide a semiconductor substrate having a patterned interconnect layer formed thereon. As an example, the semiconductor substrate can be similar to semiconductor substrate 1010, first shown in FIG. 10. As a further example, the patterned interconnect layer can be similar to patterned interconnect layer 1020, also first shown in FIG. 10.

A step 1510 of method 1500 is to deposit a first dielectric material over the patterned interconnect layer. As an example, the first dielectric material can be similar to dielectric material 1090, first shown in FIG. 10.

A step 1515 of method 1500 is to pattern the first dielectric material, using a first mask, to form a first opening and a second opening in the first dielectric material. As an example, the first opening can be similar to opening 1031, and the second opening can be similar to opening 1032, both of which are first shown in FIG. 10.

A step 1520 of method 1500 is to deposit a first electrode material on the first dielectric material and in the first and second openings. As an example, the first electrode material can be similar to electrode material 1080, first shown in FIG. 10.

A step 1525 of method 1500 is to deposit a second dielectric material on the first electrode material. As an example, the second dielectric material can be similar to dielectric material 1030, first shown in FIG. 10.

A step 1530 of method 1500 is to deposit a second electrode material on the second dielectric material. As an example, the second electrode material can be similar to electrode material 1040, first shown in FIG. 10.

A step 1535 of method 1500 is to deposit a third dielectric material on the second electrode material. As an example, the third dielectric material can be similar to dielectric material 1050, first shown in FIG. 10.

A step 1540 of method 1500 is to deposit a third electrode material on the third dielectric material. As an example, the third electrode material can be similar to electrode material 1060, first shown in FIG. 10.

A step 1545 of method 1500 is to deposit a fourth dielectric material over the third electrode material. As an example, the fourth dielectric material can be similar to dielectric material 1070, first shown in FIG. 10.

A step 1550 of method 1500 is to pattern the fourth dielectric material and the third electrode material, using a second mask, to form a top electrode of a first capacitor. As an example, the first capacitor can be similar to capacitor 1310, first shown in FIG. 13, and the top electrode of the first capacitor can be similar to electrode 1111, first shown in FIG. 11.

A step 1555 of method 1500 is to pattern the third dielectric material and the second electrode material, using a third mask, to form a middle electrode of the first capacitor and a top electrode of a second capacitor. As an example, the second capacitor can be similar to capacitor 1320, first shown in FIG. 13. As another example, the middle electrode of the first capacitor can be similar to electrode 1212, first shown in FIG. 12, and the top electrode of the second capacitor can be similar to electrode 1221, also first shown in FIG. 12.

A step 1560 of method 1500 is to pattern the second dielectric material and the first electrode material, using a fourth mask, to form a bottom electrode of the first capacitor, a bottom electrode of the second capacitor. In at least one embodiment, performing step 1560 also forms a resistor. As an example, the bottom electrode of the first capacitor can be similar to electrode 1313, and the bottom electrode of the second capacitor can be similar to electrode 1322, both of which are first shown in FIG. 13. As another example, the resistor can be similar to resistor 1330, also first shown in FIG. 13.

A step 1565 of method 1500 is to form electrical contacts to each of the top, middle, and bottom electrodes of the first capacitor and to each of the top and bottom electrodes of the second capacitor. In embodiments where step 1560 forms a resistor, step 1565 or another step can further comprise forming electrical contacts to the resistor. As an example, the electrical contacts can be similar to one or more of electrical contacts 1411, 1412, 1413, 1414, 1415, 1421, 1422, 1423, 1424, 1431, and 1432, all of which were first shown in FIG. 14.

It will be apparent to one of ordinary skill in the art that an integrated circuit having dual MIM capacitors can be formed using other process flows in addition to those described above. For example, in a non-illustrated embodiment, a semiconductor device having dual MIM capacitors can be formed by: providing a semiconductor substrate having a patterned interconnect layer formed thereon; depositing a first dielectric material on the patterned interconnect layer; patterning the first dielectric material to create a first opening to the patterned interconnect layer for a first capacitor; depositing a first electrode material over the first dielectric material and in the first opening; depositing a second dielectric material over the first electrode material; patterning the second dielectric material, the first electrode material, and the first dielectric material to create a second opening to the patterned interconnect layer for a second capacitor; depositing a second electrode material over the second dielectric material and in the second opening; depositing a third dielectric material over the second electrode material; patterning the third dielectric material and the second electrode material to define a top electrode for the first capacitor and a bottom electrode for the second capacitor; depositing a third electrode material over the third dielectric material; depositing a fourth dielectric material over the third electrode material; patterning the fourth dielectric material and the third electrode material to define a top electrode for the second capacitor; patterning the second dielectric material and the first electrode material to isolate the bottom electrode of the first capacitor and the bottom electrode of the second capacitor and to define a resistor; and creating electrical contacts to the electrodes of the capacitors and to the resistor.

The structure formed by the process described in the preceding paragraph can comprise a first capacitor similar to capacitor 710, first shown in FIG. 7, but differing at least in that additional dielectric and/or electrode material can be located at either or both ends of an electrode analogous to electrode 611 and above a portion of a dielectric material analogous to dielectric material 550. Additionally, the structure formed by the process described in the preceding paragraph can further comprise a second capacitor similar to capacitor 1320, first shown in FIG. 13, but differing at least in that additional dielectric and/or electrode material can be located at either or both ends of an electrode analogous to electrode 1221 and above a portion of a dielectric material analogous to dielectric material 1030, and in that an electrode material analogous to electrode material 1080 and a dielectric material analogous to dielectric material 1030 can have deeper openings formed therein resulting in the stated materials having a different configuration. Furthermore, the structure formed by the process described in the preceding paragraph can further comprise a resistor similar to, for example, resistor 1330, first shown in FIG. 13.

Figure 16:
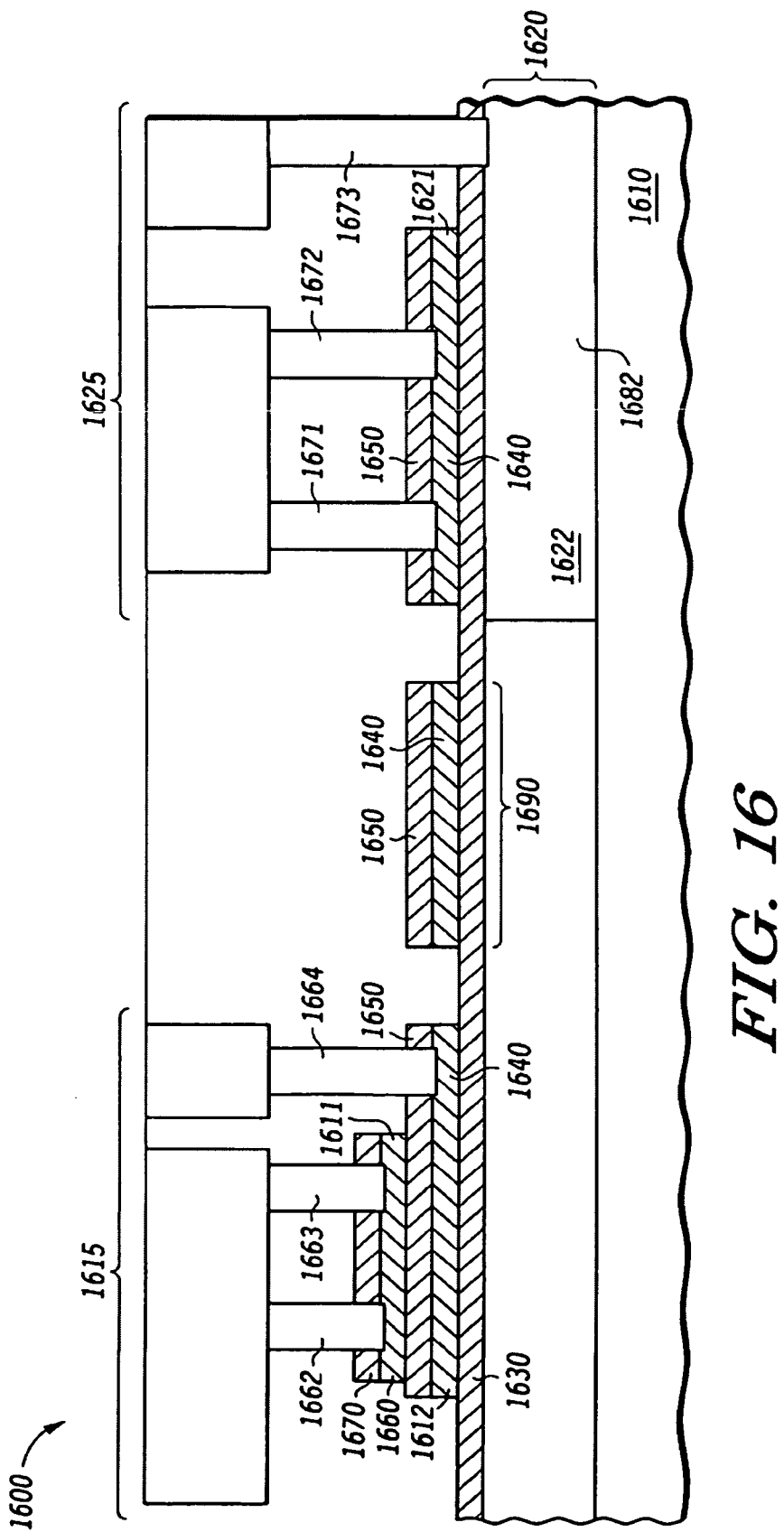
FIG. 16 is a cross-sectional view of a portion of another semiconductor device at a particular stage of a manufacturing process according to an embodiment of the invention.

FIG. 16 is a cross-sectional view of a portion of a semiconductor device 1600 at a particular stage of a manufacturing process according to an embodiment of the invention. As illustrated in FIG. 16, semiconductor device 1600 comprises a semiconductor substrate 1610 having a patterned interconnect layer 1620 formed thereon, a dielectric material 1630 over patterned interconnect layer 1620, an electrode material 1640 over dielectric material 1630, a dielectric material 1650 over electrode material 1640, an electrode material 1660 over dielectric material 1650, and a dielectric material 1670 over electrode material 1660. As an example, semiconductor substrate 1610, dielectric material 1630, electrode material 1640, dielectric material 1650, electrode material 1660, and dielectric material 1670 can be similar to, respectively, semiconductor substrate 110, dielectric material 130, electrode material 140, dielectric material 150, electrode material 160, and dielectric material 170, all of which were first shown in FIG.

1. As another example, patterned interconnect layer 1620 can be similar to patterned interconnect layer 120, first shown in FIG. 1, except patterned interconnect layer 1620, in the illustrated embodiment, comprises only a portion 1622, corresponding to portion 122 of patterned interconnect layer 120. Any portion corresponding to portion 121 of patterned interconnect layer 120 is absent from patterned interconnect layer 1620.

As further illustrated in FIG. 16, dielectric material 1670 and electrode material 1660 have been patterned to form an electrode 1611 of a capacitor 1615. As further illustrated in FIG. 16, dielectric material 1650 and electrode material 1640 have been patterned to form an electrode 1621 of a capacitor 1625, and to form an electrode 1612 of capacitor 1615. At least portions of capacitors 1615 and 1625 are formed above patterned interconnect layer 1620.

In one embodiment of the invention, portion 1622 of patterned interconnect layer 1620 forms an electrode 1682 of capacitor 1625. As an example, electrode 1611 can be a top electrode of capacitor 1615, and electrode 1612 can be a bottom electrode of capacitor 1615. As another example, electrode 1621 can be a top electrode of capacitor 1625 and electrode 1682 can be a bottom electrode of capacitor 1625.

As still further illustrated in FIG. 16, electrical contacts 1662 and 1663 have been coupled to electrode 1611 of capacitor 1615, and electrical contact 1664 has been coupled to electrode 1612 of capacitor 1615. Electrical contacts 1671 and 1672 have been coupled to electrode 1621 of capacitor 1625, and an electrical contact 1673 has been coupled to electrode 1682 of capacitor 1625. As known in the art, electrodes 1611 and 1612 of capacitor 1615 and electrodes 1621 and 1682 of capacitor 1625 could be coupled to further electrical contacts in addition to the one or two electrical contacts illustrated in FIG. 16 to be coupled to electrodes 1611, 1612, 1621, and 1682. In one embodiment, at least electrical contacts 1662, 1663, 1664, 1671, 1672, and 1673 are formed substantially simultaneously with each other.

Semiconductor device 1600 further comprises a portion 1690 formed by portions of electrode material 1640 and dielectric material 1650. In one embodiment, portion 1690 can be used to form a resistor, which resistor can be similar to resistor 230, first shown in FIG. 2. In that embodiment, electrical contacts can be coupled to the resistor in a manner similar to that shown and described for resistor 230.

Figure 17:
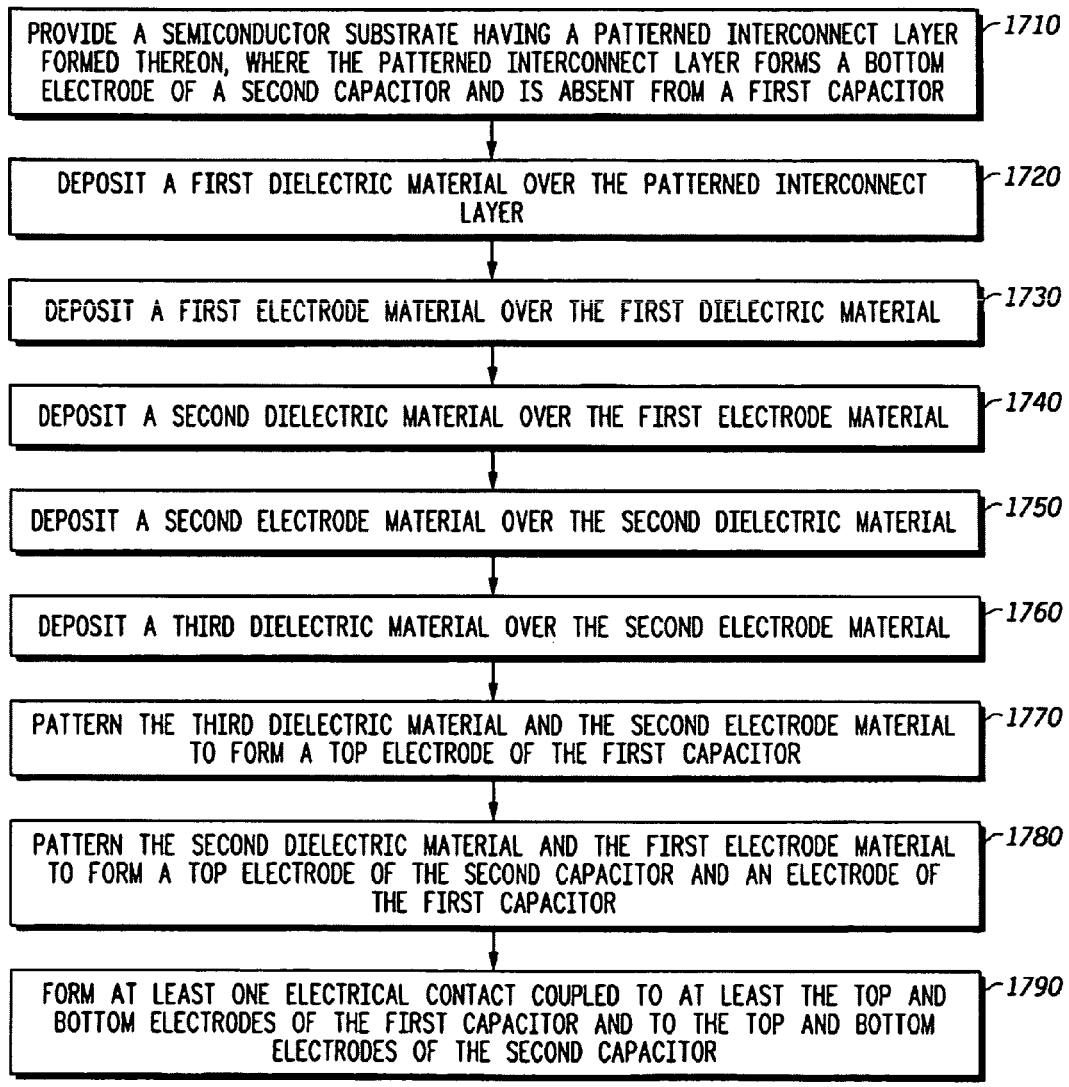
FIG. 17 is a flow chart illustrating a method of making the semiconductor device of FIG. 16 according to an embodiment of the invention.

FIG. 17 is a flow chart illustrating a method 1700 of making semiconductor device 1600 according to an embodiment of the invention. A step 1710 of method 1700 is to provide a semiconductor substrate having a patterned interconnect layer formed thereon, where the patterned interconnect layer forms a bottom electrode of a second capacitor and is absent from a first capacitor. As an example, the semiconductor substrate can be similar to semiconductor substrate 1610, first shown in FIG. 16, and the patterned interconnect layer can be similar to patterned interconnect layer 1620, also first shown in FIG. 16. As another example, the first capacitor can be similar to capacitor 1615, the second capacitor can be similar to capacitor 1625, and the bottom electrode of the second capacitor can be similar to electrode 1682, all of which were first shown in FIG. 16.

A step 1720 of method 1700 is to deposit a first dielectric material over the patterned interconnect layer. As an example, the first dielectric material can be similar to dielectric material 1630, first shown in FIG. 16.

A step 1730 of method 1700 is to deposit a first electrode material over the first dielectric material. As an example, the first electrode material can be similar to electrode material 1640, first shown in FIG. 16.

A step 1740 of method 1700 is to deposit a second dielectric material over the first electrode material. As an example, the second dielectric material can be similar to dielectric material 1650, first shown in FIG. 16.

A step 1750 of method 1700 is to deposit a second electrode material over the second dielectric material. As an example, the second electrode material can be similar to electrode material 1660, first shown in FIG. 16.

A step 1760 of method 1700 is to deposit a third dielectric material over the second electrode material. As an example, the third dielectric material can be similar to dielectric material 1670, first shown in FIG. 16.

A step 1770 of method 1700 is to pattern the third dielectric material and the second electrode material to form a top electrode of the first capacitor. As an example, the top electrode of the first capacitor can be similar to electrode 1611, first shown in FIG. 16.

A step 1780 of method 1700 is to pattern the second dielectric material and the first electrode material to form a top electrode of the second capacitor and an electrode of the first capacitor. As an example, the top electrode of the second capacitor can be similar to electrode 1621 and the electrode can be similar to electrode 1612, both of which are first shown in FIG. 16.

A step 1790 of method 1700 is to form at least one electrical contact coupled to at least the top and bottom electrodes of the first capacitor and to the top and bottom electrodes of the second capacitor. As an example, the electrical contacts can be similar to one or more of electrical contacts 1662, 1663, 1664, 1671, 1672, and 1673, all of which were first shown in FIG. 16. In one embodiment of method 1700, step 1790 comprises forming the electrical contacts simultaneously with each other.

In one embodiment of method 1700, step 1780 can be used to form a resistor over the semiconductor substrate. In that embodiment, and as an example, the resistor can be similar to 230, first shown in FIG. 2. The resistor can be formed using a portion of the first electrode material and the second dielectric material. As an example, the portion of the first electrode material and the second dielectric material can be similar to portion 1690, first shown in FIG. 16.

Although the invention has been described with reference to specific embodiments, it will be understood by those skilled in the art that various changes may be made without departing from the spirit or scope of the invention. Various examples of such changes have been given in the foregoing description. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the semiconductor device discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A semiconductor device comprising:
a semiconductor substrate;
a first capacitor comprising:
   a first portion of a patterned interconnect layer;
   a first portion of a first dielectric layer;
   a first portion of a first electrode layer;
   a first portion of at least one second dielectric layer; and
   a first portion of a second electrode layer; and
a second capacitor comprising:
   a second portion of the patterned interconnect layer;
   a second portion of the first dielectric layer; and
   a second portion of the first electrode layer.

2. The semiconductor device of claim 1, wherein:
the patterned interconnect layer is above the semiconductor substrate;
the first dielectric layer is above the patterned interconnect layer;
the first electrode layer is above the first dielectric layer;
the second dielectric layer is above the first electrode layer; and
the second electrode layer is above the second dielectric layer.

3. The semiconductor device of claim 1, further comprising:
a resistor above the patterned interconnect layer.

4. The semiconductor device of claim 1, wherein:
the first capacitor comprises a first number of dielectric layers;
the second capacitor comprises a second number of dielectric layers;
the first number of dielectric layers includes the first dielectric layer and the at least one second dielectric layer;
the second number of dielectric layers includes the first dielectric layer;
the first number of dielectric layers is greater than the second number of dielectric layers such that the first capacitor has a higher capacitance per unit area than does the second capacitor.

5. The semiconductor device of claim 1 wherein:
the first dielectric layer comprises silicon nitride.

6. The semiconductor device of claim 1 wherein:
the at least one second dielectric layer comprises a material having an effective dielectric constant greater than approximately eight.

7. The semiconductor device of claim 1 wherein:
the at least one second dielectric layer comprises:
   a first layer of hafnium oxide;
   a layer of tantalum oxide above the first layer of hafnium oxide; and
   a second layer of hafnium oxide above the layer of tantalum oxide.

8. The semiconductor device of claim 1 wherein:
the first electrode layer comprises tantalum nitride.

9. The semiconductor device of claim 1, wherein:
the first dielectric layer comprises plasma enhanced nitride.

10. The semiconductor device of claim 1, wherein:
the first capacitor further comprises:
   a first electrical contact coupled to the first portion of the patterned interconnect layer; and
   a second electrical contact coupled to the first portion of the first electrode layer.

11. The semiconductor device of claim 1, wherein:
the second capacitor further comprises:
   a first electrical contact coupled to the second portion of the patterned interconnect layer; and
   a second electrical contact coupled to the second portion of the first electrode layer.

12. The semiconductor device of claim 1, wherein:
the first capacitor further comprises:
   a first portion of a third electrode layer; and
   a first portion of a third dielectric layer.

13. The semiconductor device of claim 12, wherein:
the third electrode layer is above the first dielectric layer; and
the third dielectric layer is above the third electrode layer.

14. The semiconductor device of claim 12, wherein:
the second capacitor further comprises:
   a second portion of the third electrode layer; and
   a second portion of the third dielectric layer.

15. A semiconductor device comprising:
a semiconductor substrate;
a patterned interconnect layer above the semiconductor substrate;
a first dielectric layer above the patterned interconnect layer;
a first electrode layer above the first dielectric layer;
a second dielectric layer above the first electrode layer; and
a second electrode layer above the second dielectric layer, wherein:
   a first portion of the patterned interconnect layer is a first electrode for a first capacitor;
   a first portion of the first electrode layer is a second electrode for the first capacitor;
   a second portion of the patterned interconnect layer is a first electrode for a second capacitor; and
   a second portion of the first electrode layer is a second electrode for the second capacitor.

16. The semiconductor device of claim 15, wherein:
the first capacitor comprises a first number of dielectric layers;
the second capacitor comprises a second number of dielectric layers;
the first number of dielectric layers includes the first dielectric layer and the second dielectric layer;
the second number of dielectric layers includes the first dielectric layer; and
the first number of dielectric layers is greater than the second number of dielectric layers such that the first capacitor has a higher capacitance per unit area than does the second capacitor.

17. The semiconductor device of claim 15 wherein:
the second dielectric layer comprises:
   a first layer of hafnium oxide;
   a layer of tantalum oxide above the first layer of hafnium oxide; and
   a second layer of hafnium oxide above the layer of tantalum oxide.

18. The semiconductor device of claim 15, further comprising:
a third electrode layer above the first dielectric layer; and
a third dielectric layer above the third electrode layer, wherein:
   the first electrode layer is above the third dielectric layer; and
   a first portion of the third electrode layer is a third electrode for the first capacitor.

19. The semiconductor device of claim 18 wherein:
a second portion of the third electrode layer is a third electrode for the second capacitor.

* * * * *